United States Patent
Kusumoto et al.

(10) Patent No.: US 12,142,443 B2
(45) Date of Patent: Nov. 12, 2024

(54) SOLAR CELL

(71) Applicant: Panasonic Intellectual Property Management Co., Ltd., Osaka (JP)

(72) Inventors: Shohei Kusumoto, Osaka (JP); Kenji Kawano, Osaka (JP); Tomoyasu Yokoyama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 120 days.

(21) Appl. No.: 17/660,214

(22) Filed: Apr. 22, 2022

(65) Prior Publication Data

US 2022/0246362 A1 Aug. 4, 2022

Related U.S. Application Data

(63) Continuation of application No. PCT/JP2020/026110, filed on Jul. 3, 2020.

(30) Foreign Application Priority Data

Nov. 18, 2019 (JP) .................. 2019-208000

(51) Int. Cl.
| | |
|---|---|
| *H01G 9/20* | (2006.01) |
| *H10K 30/30* | (2023.01) |
| *H10K 30/40* | (2023.01) |
| *H10K 30/82* | (2023.01) |

(Continued)

(52) U.S. Cl.
CPC ............ *H01G 9/2009* (2013.01); *H10K 30/30* (2023.02); *H10K 30/40* (2023.02); *H10K 30/82* (2023.02); *H10K 85/30* (2023.02); *H10K 85/624* (2023.02); *H10K 85/626* (2023.02); *H10K 85/633* (2023.02)

(58) Field of Classification Search
CPC ...... H01G 9/2009; H10K 30/30; H10K 30/40; H10K 30/82; H10K 85/624; H10K 85/633; H10K 85/30; H10K 85/626; H10K 85/60
See application file for complete search history.

(56) References Cited

FOREIGN PATENT DOCUMENTS

| | | |
|---|---|---|
| JP | 2014-520386 | 8/2014 |
| JP | 2019-038714 | 3/2019 |
| WO | 2012/150529 | 11/2012 |

OTHER PUBLICATIONS

International Search Report of PCT application No. PCT/JP2020/026110 dated Sep. 1, 2020.

(Continued)

*Primary Examiner* — Andrew J Golden
(74) *Attorney, Agent, or Firm* — GREENBLUM & BERNSTEIN, P.L.C.

(57) ABSTRACT

A solar cell includes a first electrode, a second electrode, a photoelectric conversion layer interposed between the first and second electrodes, and a hole transport layer interposed between the first electrode and the photoelectric conversion layer. At least one electrode selected from the group consisting of the first and second electrodes is transparent to light. The photoelectric conversion layer includes a perovskite compound constituted by a monovalent cation, a divalent cation, and a halogen anion. The monovalent cation includes at least one selected from the group consisting of a formamidinium cation and a methylammonium cation. The divalent cation includes a Sn cation. The halogen anion includes an iodide ion. The hole transport layer includes 4,4',4''-tris[9,9-dimethyl-2-fluorenyl(4-methoxy-phenyl)amino]triphenylamine.

4 Claims, 1 Drawing Sheet

(51) Int. Cl.
 *H10K 85/30* (2023.01)
 *H10K 85/60* (2023.01)

(56) References Cited

OTHER PUBLICATIONS

Mulmudi Hemant Kumar et al., "Lead-Free Halide Perovskite Solar Cells with High Photocurrents Realized Through Vacancy Modulation", Advanced Materials, vol. 26, Issue 41, Sep. 11, 2014, 7122-7127.

Seon Joo Lee et al., "Fabrication of Efficient Formamidinium Tin Iodide Perovskite Solar Cells through SnF2-Pyrazine Complex", Journal of the American Chemical Society, 2016, vol. 138, Mar. 9, 2016, pp. 3974-3977.

Feidan Gu et al., "Lead-Free Tin-Based Perovskite Solar Cells: Strategies Toward High Performance", Solar RRL, 2019, vol. 3, Jun. 17, 2019, pp. 1900213-1-1900213-26.

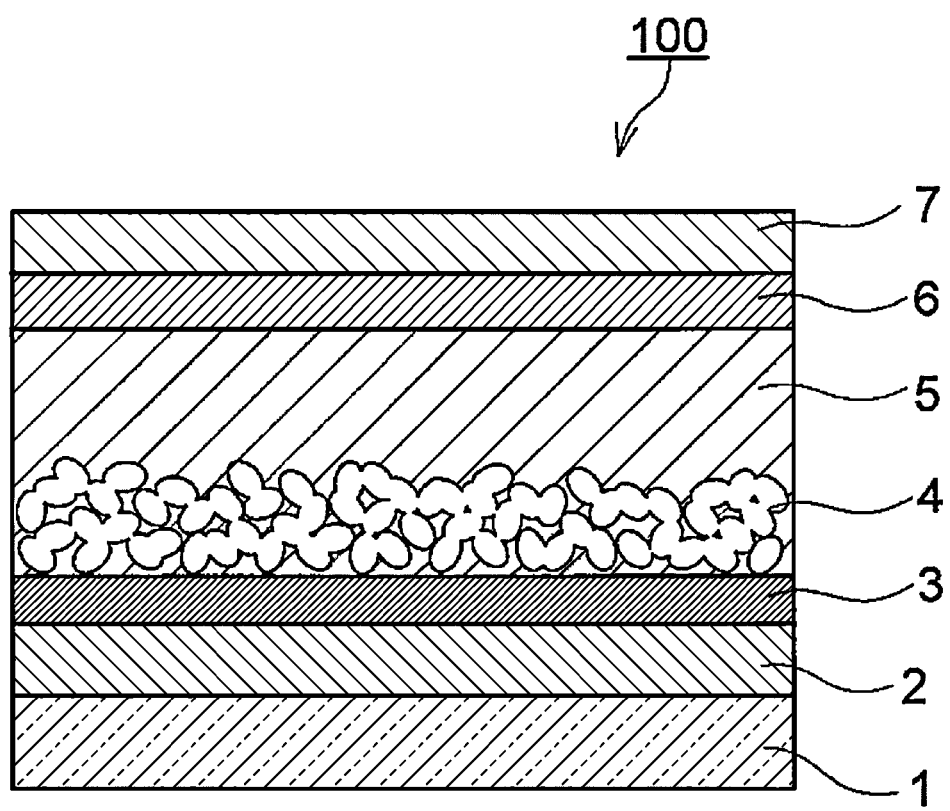

SOLAR CELL

BACKGROUND

1. Technical Field

The present disclosure relates to a solar cell.

2. Description of the Related Art

There have been various research and development activities on perovskite solar cells. A perovskite solar cell includes a perovskite compound represented by $ABX_3$ (where A represents a monovalent cation, B represents a divalent cation, and X represents a halogen anion), which serves as a photoelectric conversion material.

Mulmudi Hemant Kumar et al. ("Lead-free halide perovskite solar cells with high photocurrents realized through vacancy modulation", Advanced Materials, 2014, Volume 26, Issue 41, 7122-7127; hereinafter, this document is referred to as "NPL") proposes a perovskite solar cell that does not contain lead. The lead-free perovskite solar cell disclosed in NPL includes a perovskite compound represented by $CsSnI_3$, $TiO_2$, and Spiro-OMETAD, which serve as a photoelectric conversion material, an electron transport material, and a hole transport material, respectively.

Japanese Unexamined Patent Application Publication (Translation of PCT Application) No. 2014-520386 (hereinafter, this document is referred to as "PTL") discloses a dye-sensitized solar cell. The dye-sensitized solar cell disclosed in PTL includes at least one organic hole-conducting material, that is, hole transport material. PTL discloses several organic hole-conducting materials including Spiro-OMETAD.

SUMMARY

One non-limiting and exemplary embodiment provides a tin-based perovskite solar cell having a high photoelectric conversion efficiency.

In one general aspect, the techniques disclosed here feature a solar cell including a first electrode, a second electrode, a photoelectric conversion layer interposed between the first electrode and the second electrode, and a hole transport layer interposed between the first electrode and the photoelectric conversion layer. At least one electrode selected from the first electrode and the second electrode is transparent to light. The photoelectric conversion layer includes a perovskite compound constituted by a monovalent cation, a divalent cation, and a halogen anion. The monovalent cation includes at least one selected from the group consisting of a formamidinium cation and a methylammonium cation. The divalent cation includes a Sn cation. The halogen anion includes an iodide ion. The hole transport layer includes 4,4',4"-tris[9,9-dimethyl-2-fluorenyl(4-methoxy-phenyl)amino]triphenylamine.

The present disclosure provides a tin-based perovskite solar cell that may have a high photoelectric conversion efficiency.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWING

FIGURE is a cross-sectional view of a solar cell according to an embodiment.

DETAILED DESCRIPTIONS

Definition of Terms

The term "perovskite compound" used herein refers to a perovskite crystal structure represented by $ABX_3$ (where A represents a monovalent cation, B represents a divalent cation, and X represents a halogen anion) and a structure that includes a crystal analogous to the perovskite crystal.

The term "perovskite solar cell" used herein refers to a solar cell that includes a perovskite compound as a photoelectric conversion material.

The term "tin-based perovskite compound" used herein refers to a perovskite compound that contains tin.

The term "tin-based perovskite solar cell" used herein refers to a solar cell that includes a tin-based perovskite compound as a photoelectric conversion material.

The term "lead-based perovskite compound" used herein refers to a perovskite compound that contains lead.

The term "lead-based perovskite solar cell" used herein refers to a solar cell that includes a lead-based perovskite compound as a photoelectric conversion material.

Underlying Knowledge Forming Basis of the Present Disclosure

The knowledge on which the present disclosure is based is described below.

It is commonly known that the energy gap between the HOMO level of a hole transport material and the energy level of the upper end of the valence band of a photoelectric conversion material causes a reduction in the photoelectric conversion efficiency of a solar cell. Note that, in the present disclosure, "the energy level of the upper end of a valence band" is relative to the vacuum level.

Typical examples of hole transport materials included in recent perovskite solar cells include poly[bis(4-phenyl)(2,4,6-trimethylphenyl)amine] (hereinafter, referred to as "PTAA") and 2,2',7,7'-tetrakis-(N,N-di-p-methoxyphenylamine)9,9'-spirobifluorene (hereinafter, referred to as "spiro-OMeTAD"). The HOMO levels of these hole transport materials match with the energy level (i.e., −5.4 eV) of the upper end of the valence band of a lead-based perovskite compound. In other words, the energy gap between the HOMO levels of the above hole transport materials and the energy level of the upper end of the valence band of a lead-based perovskite compound is small.

On the other hand, the energy level of the upper end of the valence band of a tin-based perovskite compound is shallower than that of a lead-based perovskite compound by about 0.5 eV; the energy level of the upper end of the valence band of $HC(NH_2)_2SnI_3$, which is an example of the tin-based perovskite compound, is −4.9 eV. Therefore, it is necessary that a hole transport material included in a tin-based perovskite solar cell have a shallower HOMO level than that included in a lead-based perovskite solar cell.

The inventors also found that the use of a hole transport material having a HOMO level that is close to the energy level of the upper end of the valence band of a tin-based perovskite compound does not always increase the photoelectric conversion efficiency of a solar cell. One of the possible reasons is the occurrence of defects in the tin-based perovskite compound at the interface between the hole transport material and the tin-based perovskite compound.

The inventors conducted various studies and consequently found that using 4,4',4''-tris[9,9-dimethyl-2-fluorenyl(4-methoxy-phenyl)amino]triphenylamine (hereinafter, referred to as "MeO-TFATA") as a hole transport material increases the photoelectric conversion efficiency of a tin-based perovskite solar cell.

On the basis of the above findings, the inventors provide a solar cell that includes a tin-based perovskite compound and has a high photoelectric conversion efficiency.

Embodiment of the Present Disclosure

Details of an embodiment of the present disclosure are described below with reference to the attached drawing.

FIGURE is a cross-sectional view of a solar cell 100 according to this embodiment. As illustrated in FIGURE, the solar cell 100 according to this embodiment includes a first electrode 7, a second electrode 2, a photoelectric conversion layer 5 interposed between the first electrode 7 and the second electrode 2, and a hole transport layer 6 interposed between the first electrode 7 and the photoelectric conversion layer 5.

The first electrode 7 is arranged to face the second electrode 2 such that the hole transport layer 6 and the photoelectric conversion layer 5 are interposed between the first electrode 7 and the second electrode 2. At least one electrode selected from the group consisting of the first electrode 7 and the second electrode 2 is transparent to light. Note that the expression "an electrode is transparent to light" used herein means that, when the electrode is irradiated with light having wavelengths of 200 to 2,000 nm, the electrode transmits 10% or more of light with a specific wavelength.

Photoelectric Conversion Layer 5

The photoelectric conversion layer 5 includes a perovskite compound constituted by a monovalent cation, a divalent cation, and a halogen anion as a photoelectric conversion material. The photoelectric conversion material is a light-absorbing material.

In this embodiment, the perovskite compound may be a compound represented by $ABX_3$, where A represents a monovalent cation, B represents a divalent cation, and X represents a halogen anion.

Hereinafter, A, B, and X are referred to as "A-site", "B-site", and "X-site" in accordance with the expressions commonly used for perovskite compounds.

In this embodiment, the perovskite compound may have a perovskite crystal structure represented by $ABX_3$. For example, a monovalent cation is located at the A-site, a divalent cation is located at the B-site, and a halogen anion is located at the X-site.

A-Site

The monovalent cation located at the A-site includes at least one selected from the group consisting of a formamidinium cation (i.e., $NH_2CHNH_2^+$) and a methylammonium cation (i.e., $CH_3NH_3^+$). When the A-site includes at least one selected from the group consisting of a formamidinium cation and a methylammonium cation, a tin-based perovskite solar cell having a high photoelectric conversion efficiency may be produced.

The monovalent cation located at the A-site may further include a guanidinium cation (i.e., $CH_6N_3^+$) in order to increase the photoelectric conversion efficiency of the solar cell. The monovalent cation located at the A-site may include a monovalent cation other than a formamidinium cation, a methylammonium cation, or a guanidinium cation. Examples of the other monovalent cation include an organic cation and an alkali metal cation. Examples of the organic cation include a phenyl ethyl ammonium cation (i.e., $C_6H_5C_2H_4NH_3^+$). Examples of the alkali metal cation include a cesium cation (i.e., $Cs^+$).

The sentence "the A-site primarily includes at least one selected from the group consisting of a formamidinium cation and a methylammonium cation" means that the ratio of the total number of moles of the formamidinium cation and the methylammonium cation to the total number of moles of all the monovalent cations exceeds 50%.

The A-site may be constituted essentially by only at least one selected from the group consisting of a formamidinium cation and a methylammonium cation. The sentence "the A-site is constituted essentially by only at least one selected from the group consisting of a formamidinium cation and a methylammonium cation" means that the ratio of the total number of moles of the formamidinium cation and the methylammonium cation to the total number of moles of all the monovalent cations is equal to or greater than 90% and is desirably equal to or greater than 95%.

The A-site may primarily include a formamidinium cation. The sentence "the A-site primarily includes a formamidinium cation" means that the ratio of the number of moles of the formamidinium cation to the total number of moles of all the monovalent cations is the highest. The A-site may be constituted essentially by only a formamidinium cation. The sentence "the A-site is constituted essentially by only a formamidinium cation" means that the ratio of the number of moles of the formamidinium cation to the total number of moles of all the monovalent cations is equal to or greater than 90% and is desirably equal to or greater than 95%.

B-Site

The divalent cation located at the B-site includes a Sn cation, that is, Sn'. The divalent cation may include a Sn cation at a proportion of equal to or greater than 50 mol %. The sentence "the divalent cation includes a Sn cation at a proportion of equal to or greater than 50 mol %" means that the ratio of the number of moles of the Sn cation to the total number of moles of all the divalent cations is of equal to or greater than 50%. The divalent cation may be constituted by only Sn.

X-Site

The halogen anion located at the X-site includes an iodide ion. When the X-site includes an iodide ion, a tin-based perovskite solar cell having a high photoelectric conversion efficiency may be produced. The halogen anion located at the X-site may be constituted by two or more types of halogen ions.

The X-site may primarily include an iodide ion. The sentence "the halogen anion primarily includes an iodide ion" means that the number of moles of the iodide ion to the total number of moles of all the halogen anions is the highest. The X-site may be constituted essentially by only an iodide ion. The sentence "the X-site is constituted essentially by only an iodide ion" means that the ratio of the number of moles of the iodide ion to the total number of moles of all the halogen anions is equal to or greater than 90% and is desirably equal to or greater than 95%.

The photoelectric conversion layer 5 may include a material other than the photoelectric conversion material. For example, the photoelectric conversion layer 5 may further include a quencher substance in order to reduce the density of defects in the perovskite compound. The quencher substance is a fluorine compound, such as tin fluoride. The molar ratio of the quencher substance to the photoelectric conversion material may be equal to or greater than 5% and equal to or less than 20%.

The photoelectric conversion layer 5 may primarily include the perovskite compound constituted by a monovalent cation, a divalent cation including a Sn cation, and a halogen anion.

The sentence "the photoelectric conversion layer 5 primarily includes the perovskite compound constituted by a monovalent cation, a divalent cation including a Sn cation, and a halogen anion" means that the content of the perovskite compound constituted by a monovalent cation, a divalent cation including a Sn cation, and a halogen anion in the photoelectric conversion layer 5 is equal to or greater than 70% by mass and is desirably equal to or greater than 80% by mass.

The photoelectric conversion layer 5 may include impurities. The photoelectric conversion layer 5 may further include a compound other than the above perovskite compound.

The thickness of the photoelectric conversion layer 5 may be equal to or greater than 100 nm and equal to or less than 10 μm and is desirably equal to or greater than 100 nm and equal to or less than 1,000 nm. The thickness of the photoelectric conversion layer 5 depends on the capability of the photoelectric conversion layer 5 to absorb light.

Hole Transport Layer 6

The hole transport layer 6 includes MeO-TFATA represented by Structural Formula (1) below, which serves as a hole transport material.

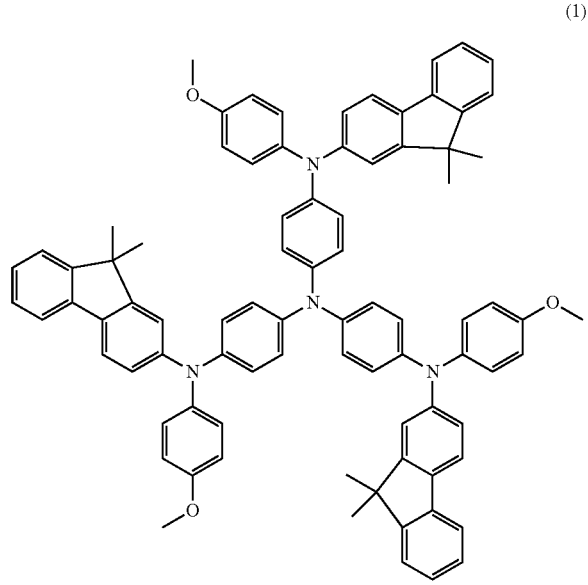 [SMILES: COc1ccc(N(c2ccc(N(c3ccc(N(c4ccc(OC)cc4)c4ccc5c(c4)C(C)(C)c4ccccc4-5)cc3)c3ccc(N(c4ccc(OC)cc4)c4ccc5c(c4)C(C)(C)c4ccccc4-5)cc3)cc2)c2ccc3c(c2)C(C)(C)c2ccccc2-3)cc1]

(1)

MeO-TFATA has a HOMO level that is close to the energy level of the upper end of the valence band of a tin-based perovskite compound. Furthermore, it is considered that MeO-TFATA reduces the likelihood of defects occurring at the interface between a tin-based perovskite compound and the hole transport material. That is, it is considered that the density of defects at the interface between a hole transport layer 6 including MeO-TFATA and a photoelectric conversion layer 5 including a tin-based perovskite compound is small. Therefore, when the hole transport layer 6 includes MeO-TFATA, the solar cell 100 that includes a tin-based perovskite compound has a high photoelectric conversion efficiency.

The hole transport layer 6 may include an organic substance, an inorganic semiconductor, and the like in addition to MeO-TFATA.

Typical examples of organic substances included in the hole transport layer 6 include spiro-OMeTAD, PTAA, poly (3-hexylthiophene-2,5-diyl) (hereinafter, referred to as "P3HT"), poly(3,4-ethylenedioxythiophene) (hereinafter, referred to as "PEDOT"), and copper phthalocyanine (hereinafter, referred to as "CuPC").

Examples of the inorganic semiconductor include $Cu_2O$, $CuGaO_2$, CuSCN, CuI, $NiO_x$, $MoO_x$, $V_2O_5$, and carbon materials, such as graphene oxide.

The hole transport layer 6 may include a plurality of sublayers composed of different materials. In such a case, at least one of the sublayers includes MeO-TFATA.

The thickness of the hole transport layer 6 is desirably equal to or greater than 1 nm and equal to or less than 1,000 nm and is more desirably equal to or greater than 10 nm and equal to or less than 500 nm. When the thickness of the hole transport layer 6 is equal to or greater than 1 nm and equal to or less than 1,000 nm, sufficiently high hole transport performance may be achieved. When the thickness of the hole transport layer 6 is equal to or greater than 1 nm and equal to or less than 1,000 nm, furthermore, the resistance of the hole transport layer 6 is low. This makes it possible to convert light into electricity with high efficiency.

The hole transport layer 6 may include an additive and a solvent. For example, the additive and solvent may have the advantageous effects of:
 (i) increasing the hole conductivity in the hole transport layer 6;
 (ii) causing crosslinking between the photoelectric conversion layer 5 and the hole transport layer 6 to increase the efficiency of extraction of positive holes; and
 (iii) deactivating defect sites present in the surface of the photoelectric conversion layer 5.

Examples of the additive include an ammonium salt and an alkali metal salt. In other words, the hole transport layer 6 may include an ammonium salt and an alkali metal salt. Examples of the ammonium salt include tetrabutylammonium perchlorate, tetraethylammonium hexafluorophosphate, an imidazolium salt, and a pyridinium salt. Examples of the alkali metal salt include lithium bis(trifluoromethanesulfonyl)imide (hereinafter, referred to as "LiTFSI"), $LiPF_6$, $LiBF_4$, lithium perchlorate, and potassium tetrafluoroborate.

The hole transport layer 6 desirably includes LiTFSI in order to increase the photoelectric conversion efficiency of the solar cell. When the hole transport layer 6 further includes LiTFSI, the hole transport performance of the hole transport layer 6 may be enhanced and, consequently, the photoelectric conversion efficiency of the solar cell 100 may be further increased. When the hole transport layer 6 includes MeO-TFATA and LiTFSI, tert-butylpyridine (hereinafter, referred to as "TBP") is desirably added to the hole transport layer 6. The addition of TBP enhances the miscibility of MeO-TFATA and LiTFSI with each other. This enables MeO-TFATA and LiTFSI to be mixed with each other in a uniform manner and further enhances the hole transport performance of the hole transport layer 6.

The concentration of the additive in the hole transport layer 6 is desirably equal to or greater than 0.1 mmol/L and equal to or less than 100 mmol/L and is more desirably equal to or greater than 1 mmol/L and equal to or less than 10 mmol/L. When the above additive concentration is equal to or greater than 0.1 mmol/L and equal to or less than 100 mmol/L, the hole transport performance of the hole transport layer 6 may be enhanced to a sufficient degree.

The solvent included in the hole transport layer 6 may have a high ionic conductivity. The solvent may be either aqueous or organic. The solvent is desirably an organic solvent in consideration of the stability of a solute. Examples of the organic solvent include heterocyclic compounds, such as TBP, pyridine, and N-methylpyrrolidone.

The solvent included in the hole transport layer 6 may be an ionic liquid. The ionic liquid may be used alone or in a mixture with another solvent. It is desirable to use an ionic liquid in terms of low volatility and high flame retardancy. Examples of the ionic liquid include imidazolium compounds, such as 1-ethyl-3-methylimidazolium tetracyanoborate, pyridines, alicyclic amines, aliphatic amines, and azonium amines.

As illustrated in FIGURE, the solar cell 100 includes a substrate 1 and a second electrode 2, an electron transport layer 3, a porous layer 4, a photoelectric conversion layer 5, a hole transport layer 6, and a first electrode 7 that are stacked on and above the substrate 1 in this order. The solar cell 100 does not necessarily include the substrate 1. The solar cell 100 does not necessarily include the electron transport layer 3. The solar cell 100 does not necessarily include the porous layer 4.

Substrate 1

The substrate 1 supports the first electrode 7, the hole transport layer 6, the photoelectric conversion layer 5, the porous layer 4, the electron transport layer 3, and the second electrode 2. The substrate 1 may be formed of a transparent material. Examples of the substrate 1 include a glass substrate and a plastic substrate. Examples of the plastic substrate include a plastic film. In the case where the second electrode 2 has a sufficiently high strength, the solar cell 100 does not necessarily include the substrate 1 because the second electrode 2 is capable of supporting the first electrode 7, the hole transport layer 6, the photoelectric conversion layer 5, the porous layer 4, and the electron transport layer 3.

First Electrode 7 and Second Electrode 2

The first electrode 7 and the second electrode 2 have electric conductivity. At least one electrode selected from the group consisting of the first electrode 7 and the second electrode 2 is transparent to light. The electrode transparent to light may transmit visible to near-infrared light. The electrode transparent to light may be formed of a transparent material having electric conductivity.

Examples of such a material include:
(i) titanium oxide doped with at least one selected from the group consisting of lithium, magnesium, niobium, and fluorine;
(ii) gallium oxide doped with at least one selected from the group consisting of tin and silicon;
(iii) gallium nitride doped with at least one selected from the group consisting of silicon and oxygen;
(iv) indium-tin composite oxide;
(v) tin oxide doped with at least one selected from the group consisting of antimony and fluorine;
(vi) zinc oxide doped with at least one selected from boron, aluminum, gallium, and indium; and
(vii) composites of any of the above materials.

The electrode transparent to light may be an electrode formed of an opaque material, the electrode having a pattern formed therein which transmits light. Examples of the light-transmitting pattern include a linear pattern, a wavy line pattern, a lattice pattern, and a perforated metal-like pattern constituted by a number of fine through-holes arranged in a regular or irregular manner. When the electrode transparent to light has the pattern, light can pass through portions of the electrode in which an electrode material is absent. Examples of the opaque material include platinum, gold, silver, copper, aluminum, rhodium, indium, titanium, iron, nickel, tin, zinc, and alloys including any of the above metals. A carbon material having electric conductivity may be used as an opaque material.

In the case where the solar cell 100 includes an electron transport layer 3 interposed between the photoelectric conversion layer 5 and the second electrode 2, the second electrode 2 does not necessarily have a property of blocking positive holes migrated from the photoelectric conversion layer 5. Thus, the material constituting the second electrode 2 may be a material capable of forming ohmic contact with the photoelectric conversion layer 5.

In the case where the solar cell 100 does not include the electron transport layer 3, the second electrode 2 is formed of, for example, a material having a property of blocking positive holes migrated from the photoelectric conversion layer 5. In such a case, the second electrode 2 is not in ohmic contact with the photoelectric conversion layer 5. The property of blocking positive holes migrated from the photoelectric conversion layer 5 is a property of allowing only electrons generated in the photoelectric conversion layer 5 to pass through the second electrode 2 and inhibiting positive holes from passing through the second electrode 2. The Fermi energy of the material having a property of blocking the positive holes is higher than the energy level of the upper end of the valence band of the photoelectric conversion layer 5. The Fermi energy of the material having a property of blocking the positive holes may be higher than the Fermi energy of the photoelectric conversion layer 5. Examples of the material having a property of blocking the positive holes include aluminum.

Since the solar cell 100 includes a hole transport layer 6 interposed between the photoelectric conversion layer 5 and the first electrode 7, the first electrode 7 does not necessarily have a property of blocking electrons migrated from the photoelectric conversion layer 5. In this case, the first electrode 7 may be in ohmic contact with the photoelectric conversion layer 5.

The material having a property of blocking positive holes migrated from the photoelectric conversion layer 5 may be opaque to light. The material having a property of blocking electrons migrated from the photoelectric conversion layer 5 may also be opaque to light. Therefore, in the case where the first electrode 7 or the second electrode 2 is formed of such a material, the first electrode 7 or the second electrode 2 has the above-described pattern that enables light to pass through the first electrode 7 or the second electrode 2.

The transmittance values of light through the first electrode 7 and the second electrode 2 may be equal to or greater than 50% and may be equal to or greater than 80%. The wavelength of light that passes through the electrodes varies with the absorption wavelength of the photoelectric conversion layer 5. The thicknesses of the first electrode 7 and the second electrode 2 fall within the range of, for example, equal to or greater than 1 nm and equal to or less than 1,000 nm.

Electron Transport Layer 3

The electron transport layer 3 includes a semiconductor. The electron transport layer 3 is desirably formed of a semiconductor having a band gap of equal to or greater than 3.0 eV. Forming the electron transport layer 3 using a semiconductor having a band gap of equal to or greater than 3.0 eV enables visible light and infrared light to reach the photoelectric conversion layer 5. Examples of the semiconductor include organic and inorganic n-type semiconductors.

Examples of the organic n-type semiconductors include an imide, a quinone, fullerene, and a fullerene derivative. Examples of the inorganic n-type semiconductors include a metal oxide, a metal nitride, and a perovskite oxide. Examples of the metal oxide include oxides of Cd, Zn, In, Pb, Mo, W, Sb, Bi, Cu, Hg, Ti, Ag, Mn, Fe, V, Sn, Zr, Sr, Ga, Si, and Cr. Among these, $TiO_2$ is desirable. Examples of the metal nitride include GaN. Examples of the perovskite oxide include $SrTiO_3$ and $CaTiO_3$.

The electron transport layer 3 may be formed of a substance having a band gap of greater than 6.0 eV. Examples of the substance having a band gap of greater than 6.0 eV include:
(i) halides of an alkali metal or alkaline-earth metal, such as lithium fluoride and calcium fluoride;
(ii) alkali metal oxides, such as magnesium oxide; and
(iii) silicon dioxide.

In such a case, the thickness of the electron transport layer 3 may be set to, for example, 10 nm or less in order to maintain the electron transport performance of the electron transport layer 3 at a certain level.

The electron transport layer 3 may include a plurality of sublayers formed of different materials.

Porous Layer 4

The porous layer 4 facilitates the formation of the photoelectric conversion layer 5. The material constituting the photoelectric conversion layer 5 enters the pores of the porous layer 4. This reduces the likelihood of the material constituting the photoelectric conversion layer 5 being rejected or aggregating on the surface of the electron transport layer 3. Thus, the porous layer 4 serves as a foundation of the photoelectric conversion layer 5 and enables the photoelectric conversion layer 5 to be formed as a uniform film. The photoelectric conversion layer 5 may be formed by applying a solution onto the electron transport layer 3 by spin coating and heating the resulting coating film.

The porous layer 4 causes light scattering. This may increase the optical path length of light that passes through the photoelectric conversion layer 5. The increase in the optical path length may result in increases in the amounts of electrons and positive holes generated in the photoelectric conversion layer 5.

The porous layer 4 is formed on the electron transport layer 3 by, for example, a coating method.

The porous layer 4 serves as a foundation to form the photoelectric conversion layer 5. The porous layer 4 does not inhibit electrons from migrating from the photoelectric conversion layer 5 toward the second electrode 2.

The porous layer 4 includes a porous body. Examples of the porous body include a porous body formed of a series of insulative or semiconductive particles. Examples of the insulative particles include aluminum oxide particles and silicon oxide particles. Examples of the semiconductive particles include particles of an inorganic semiconductor. Examples of the inorganic semiconductor include metal oxides (including perovskite oxides), metal sulfides, and metal chalcogenides. Examples of the metal oxides include oxides of Cd, Zn, In, Pb, Mo, W, Sb, Bi, Cu, Hg, Ti, Ag, Mn, Fe, V, Sn, Zr, Sr, Ga, Si, and Cr. Among these, $TiO_2$ is desirable. Examples of the perovskite oxides include $SrTiO_3$ and $CaTiO_3$. Examples of the metal sulfides include CdS, ZnS, $In_2S_3$, SnS, PbS, $Mo_2S$, $WS_2$, $Sb_2S_3$, $Bi_2S_3$, $ZnCdS_2$, and $Cu_2S$. Examples of the metal chalcogenides include CdSe, CsSe, $In_2Se_3$, $WSe_2$, HgS, SnSe, PbSe, and CdTe.

The thickness of the porous layer 4 is desirably equal to or greater than 0.01 μm and equal to or less than 10 μm and is further desirably equal to or greater than 0.1 μm and equal to or less than 1 μm. It is desirable to maximize the surface roughness of the porous layer 4. Specifically, the surface roughness coefficient calculated as [Effective area/Projected area] is desirably equal to or greater than 10 and is further desirably equal to or greater than 100, where "Projected area" is the area of the shadow of an object irradiated with light which is formed in a direction opposite to the direction of the light, and "Effective area" is the actual surface area of the object. The effective area can be calculated on the basis of the volume of the object, which can be determined from the projected area and thickness of the object, and the specific surface area and bulk density of the material constituting the object. The above specific surface area is measured by, for example, a nitrogen adsorption method.

Actions and Effects of Solar Cell

The fundamental actions and effects of the solar cell 100 are described below. Upon the solar cell 100 being irradiated with light, the photoelectric conversion layer 5 absorbs the light and generates excited electrons and positive holes. The excited electrons migrate toward the electron transport layer 3, while the positive holes generated in the photoelectric conversion layer 5 migrate toward the hole transport layer 6. The electron transport layer 3 and the hole transport layer 6 are electrically connected to the second electrode 2 and the first electrode 7, respectively. A current is extracted from the second electrode 2 and the first electrode 7, which serve as negative and positive electrodes, respectively.

Method for Producing Solar Cell 100

The solar cell 100 can be produced by, for example, the following method.

First, a second electrode 2 is formed on the surface of a substrate 1 by chemical vapor deposition (hereinafter, referred to as "CVD") or sputtering.

An electron transport layer 3 is formed on the second electrode 2 by a coating method, such as spin coating, or sputtering.

A porous layer 4 is formed on the electron transport layer 3 by a coating method, such as spin coating.

A photoelectric conversion layer 5 is formed on the porous layer 4. The photoelectric conversion layer 5 may be formed by, for example, the following method. A method for forming a photoelectric conversion layer 5 including a perovskite compound represented by $HC(NH_2)_2SnI_3$ (hereinafter, referred to as "$FASnI_3$") is described below as an example.

$SnI_2$ and $HC(NH_2)_2I$ (hereinafter, referred to as "FAI") are added to an organic solvent to form a liquid mixture. Examples of the organic solvent include a mixture (volume ratio=1:1) of dimethyl sulfoxide (hereinafter, referred to as "DMSO") and N,N-dimethylformamide (hereinafter, referred to as "DMF").

The molar concentration of $SnI_2$ may be equal to or greater than 0.8 mol/L and equal to or less than 2.0 mol/L and may be equal to or greater than 0.8 mol/L and equal to or less than 1.5 mol/L.

The molar concentration of FAI may be equal to or greater than 0.8 mol/L and equal to or less than 2.0 mol/L and may be equal to or greater than 0.8 mol/L and equal to or less than 1.5 mol/L.

The liquid mixture is heated to a temperature of equal to or greater than 40° C. and equal to or less than 180° C. Hereby, a mixed solution including $SnI_2$ and FAI dissolved therein is prepared. The mixed solution is left to stand at room temperature.

The mixed solution is subsequently applied onto the porous layer 4 by spin coating to form a coating film. The coating film is heated at a temperature of equal to or greater than 40° C. and equal to or less than 200° C. for 15 minutes or more and 1 hour or less. Hereby, a photoelectric conversion layer 5 is formed. In the case where the application of the mixed solution is done by spin coating, a poor solvent may be added dropwise to the mixed solution during spin coating. Examples of the poor solvent include toluene, chlorobenzene, and diethyl ether.

The mixed solution may include a quencher substance, such as tin fluoride. The concentration of the quencher substance may be equal to or greater than 0.05 mol/L and equal to or less than 0.4 mol/L. The quencher substance suppresses the formation of defects in the photoelectric conversion layer 5. One of the possible reasons for the formation of defects in the photoelectric conversion layer 5 is an increase in the amount of Sn holes due to an increase in the amount of $Sn^{4+}$.

A hole transport layer 6 is formed on the photoelectric conversion layer 5. Examples of the method for forming the hole transport layer 6 include a coating method and a printing method. Examples of the coating method include doctor blade coating, bar coating, spray coating, dip coating, and spin coating. Examples of the printing method include screen printing. Alternatively, a hole transport layer 6 may be formed using a mixture of a plurality of materials and subsequently pressed or heat-treated. In the case where the material constituting the hole transport layer 6 is an organic low-molecular substance or an inorganic semiconductor, the hole transport layer 6 may be formed by vacuum deposition.

Finally, a first electrode 7 is formed on the hole transport layer 6. Hereby, a solar cell 100 is formed. The first electrode 7 may be formed by CVD or sputtering.

EXAMPLES

The present disclosure is described in further details with reference to Examples below.

Examples 1

In Example 1, the solar cell 100 illustrated in FIGURE was prepared in the following manner.

A conductive glass substrate having a thickness of 1 mm which was provided with an indium-doped $SnO_2$ layer disposed on the surface thereof (produced by Geomatec Co., Ltd.) was prepared indoor as a substrate 1 and a second electrode 2. The glass substrate and the $SnO_2$ layer served as a substrate 1 and a second electrode 2, respectively.

A titanium oxide layer having a thickness of about 10 nm was formed on the second electrode 2 by sputtering. The titanium oxide layer served as an electron transport layer 3.

Subsequently, a porous layer 4 was formed indoor, in the following manner.

A high-purity titanium oxide powder having an average primary particle size of 30 nm (produced by GreatCell Solar) was dispersed in ethyl cellulose to prepare a titanium oxide paste for screen printing.

The titanium oxide paste was applied onto the second electrode 2 to form a coating film. The coating film was dried and then heat-treated at 500° C. for 30 minutes in the air to form a porous titanium oxide layer having a thickness of 200 nm. The porous titanium oxide layer served as a porous layer 4.

A solution including $SnI_2$ (produced by Sigma Aldrich), $SnF_2$ (produced by Sigma Aldrich), and FAI (produced by GreatCell Solar) was prepared in a glove box. The concentrations of $SnI_2$, $SnF_2$, and FAI in the solution were 1.2 mol/L, 0.12 mol/L, and 1.2 mol/L, respectively. The solvent included in the solution was a mixture of DMSO and DMF (DMSO:DMF=1:1 by volume).

Subsequently, the multilayer body constituted by the substrate 1, the second electrode 2, the electron transport layer 3, and the porous layer 4 was transferred into a glove box.

In the glove box, 100 μL of the solution was applied onto the porous layer 4 by spin coating to form a coating film. The coating film had a thickness of 40 nm. Since the pores of the porous layer 4 were impregnated with part of the solution, the thickness of the coating film includes the thickness (i.e., 200 nm) of the porous layer 4.

The coating film was heat-treated on a hot plate placed inside the glove box at 80° C. for 30 minutes to form a photoelectric conversion layer 5. The photoelectric conversion layer 5 primarily included a perovskite compound represented by $FASnI_3$. The energy level of the lower end of the conduction band of the perovskite compound represented by $FASnI_3$ was −3.5 eV relative to the vacuum level. The energy level of the upper end of the valence band of the perovskite compound represented by $FASnI_3$ was −4.9 eV relative to the vacuum level.

In a glove box, a toluene solution containing MeO-TFATA (purchased from Okumoto Laboratory Co., Ltd.) at a concentration of 12 mg/mL was prepared. The toluene solution containing MeO-TFATA was applied onto the photoelectric conversion layer 5 by spin coating to form a hole transport layer 6.

Finally, in a glove box, a gold film having a thickness of 100 nm was formed on the hole transport layer 6 by vapor deposition. Hereby, a first electrode 7 was formed. The resulting multilayer body was sandwiched between square glass plates with a side of 20 mm (thickness: 1.1 mm, produced by EHC Co., Ltd.) in order to perform sealing. The sealed solar cell was removed from the glove box. Hereby, a solar cell of Example 1 was prepared. Note that the measurements and calculations described below were conducted indoor.

Example 2

A solar cell was prepared as in Example 1, except that the following items were changed in the step of preparing the toluene solution used for forming the hole transport layer 6:
  (i) an acetonitrile solution containing LiTFSI (produced by Sigma Aldrich) at a concentration of 170 mg/mL was prepared; and
  (ii) a toluene solution containing the acetonitrile solution of LiTFSI described in (i), TBP (produced by Sigma Aldrich), and MeO-TFATA was prepared (the concentration of the acetonitrile solution of LiTFSI: 5.25 μL/mL, the concentration of TBP: 6.17 μL/mL, and the concentration of MeO-TFATA: 12 mg/mL). The solution prepared in (ii) was used instead of the toluene solution used in Example 1.

Example 3

A solar cell was prepared as in Example 1, except that the following items were changed in the preparation of the solution used for forming the photoelectric conversion layer 5:
  (i) a solution containing $SnI_2$ (produced by Sigma Aldrich), $SnF_2$ (produced by Sigma Aldrich), FAT (produced by GreatCell Solar), and $CH_6N_3I$ (hereinafter, referred to as "GAT") was prepared (SnI$_2$: 1.2 mol/L, SnF$_2$: 0.12 mol/L, FAI: 1.0 mol/L, and GAI: 0.2 mol/L); and (ii) the solvent prepared in (i) was a mixture of DMSO and DMF (DMSO:DMF=1:1 by volume).

The photoelectric conversion layer 5 prepared in Example 3 primarily included a perovskite compound represented by GA$_{0.17}$FA$_{0.83}$SnI$_3$. The energy level of the lower end of the conduction band of the perovskite compound represented by GA$_{0.17}$FA$_{0.83}$SnI$_3$ was −3.5 eV relative to the vacuum level. The energy level of the upper end of the valence band of the perovskite compound represented by GA$_{0.17}$FA$_{0.83}$SnI$_3$ was −4.9 eV relative to the vacuum level.

Example 4

A solar cell was prepared as in Example 3, except that the following item was changed in the formation of the hole transport layer 6:
(i) the toluene solution used in Example 2 was used as a toluene solution for forming the hole transport layer 6.

Comparative Example 1

A solar cell was prepared as in Example 1, except that the following item was changed in the formation of the hole transport layer 6:
(i) a toluene solution containing PTAA (available from Sigma Aldrich) at a concentration of 12 mg/mL was prepared instead of the toluene solution of MeO-TFATA, and this toluene solution was used for forming the hole transport layer 6.

Comparative Example 2

A solar cell was prepared as in Example 1, except that the following items were changed in the step of preparing the toluene solution used for forming the hole transport layer:
(i) an acetonitrile solution containing LiTFSI (produced by Sigma Aldrich) at a concentration of 170 mg/mL was prepared; and
(ii) a chlorobenzene solution containing the acetonitrile solution of LiTFSI, TBP (produced by Sigma Aldrich), and Spiro-OMETAD was prepared (the concentration of the acetonitrile solution of LiTFSI: 17.5 µL/mL, the concentration of TBP: 20 µL/mL, and the concentration of Spiro-OMETAD: 50 mg/mL). The solution prepared in (ii) was used instead of the toluene solution used in Example 1.

Comparative Example 3

A solar cell was prepared as in Example 1, except that the following item was changed in the preparation of the toluene solution used for forming the hole transport layer 6:
(i) a toluene solution containing P3HT (produced by Sigma Aldrich) at a concentration of 10 mg/mL was prepared instead of the toluene solution of MeO-TFATA, and this toluene solution was used for forming the hole transport layer 6.

Comparative Example 4

A solar cell was prepared as in Example 1, except that the following items were changed in the step of preparing the toluene solution used for forming the hole transport layer 6:
(i) an acetonitrile solution containing LiTFSI (produced by Sigma Aldrich) at a concentration of 170 mg/mL was prepared; and
(ii) a toluene solution containing the acetonitrile solution of LiTFSI, TBP (produced by Sigma Aldrich), and P3HT was prepared (the concentration of the acetonitrile solution of LiTFSI: 5.25 µL/mL, the concentration of TBP: 6.17 µL/mL, and the concentration of P3HT: 10 mg/mL). The solution prepared in (ii) was used instead of the toluene solution used in Example 1.

Measurement of Photoelectric Conversion Efficiency

Each of the solar cells prepared in Examples 1 to 4 and Comparative examples 1 to 4 was irradiated with artificial sunlight having an intensity of 100 mW/cm$^2$ using a solar simulator "OTENTO-SUN V Solar Simulator" produced by Bunkoukeiki Co., Ltd. in order to determine the open circuit voltage Voc, short circuit current density Jsc, and fill factor FF of the solar cell, and the photoelectric conversion efficiency of the solar cell was calculated from Voc, Jsc, and FF using the following relationship:

$$\text{Conversion efficiency}=(Voc \times Jsc \times FF)/(\text{Energy of incident light})$$

Table 1 lists the Voc, Jsc, FF, and photoelectric conversion efficiency of each of the solar cells.

Calculation of Energy Levels of Conduction Band Lower End and Valence Band Upper End of Perovskite Compound Included in Photoelectric Conversion Layer 5

For each of Examples and Comparative examples, a sample constituted by a substrate 1, a second electrode 2, an electron transport layer 3, a porous layer 4, and a photoelectric conversion layer 5 was prepared. The sample did not include a hole transport layer 6 and a first electrode 7. That is, the surface of the photoelectric conversion layer 5 was exposed.

The energy level of the lower end of the conduction band of the perovskite compound included in the photoelectric conversion layer 5 of the sample was measured using ultraviolet photoelectron spectroscopy and a transmittance measuring method, in the following manner.

Each of the samples was subjected to ultraviolet photoelectron spectroscopy using an ultraviolet photoelectron spectroscopy equipment "PHI 5000 VersaProbe" produced by ULVAC-PHI, Inc. in order to determine the energy level of the upper end of the valence band of the tin-based perovskite compound included in the sample.

The sample was then subjected to transmittance measurement using a transmittance measuring equipment "SlidSpec-3700" produced by Shimadzu Corporation. On the basis of the results of the transmittance measurement, the band gap of the tin-based perovskite compound included in the sample was determined.

The energy level of the lower end of the conduction band of the perovskite compound was calculated on the basis of the energy level of the upper end of the valence band and the band gap.

TABLE 1

| | Hole transport layer 6 | | | Solar cell properties | | | |
|---|---|---|---|---|---|---|---|
| | Hole transport material | Additive | Photoelectric conversion layer 5 | Voc [mV] | Jsc [mAcm$^{-2}$] | FF [a.u.] | photoelectric conversion efficiency [%] |
| Example 1 | MeO-TFATA | — | FASnI$_3$ | 304 | 14.5 | 0.58 | 2.6 |
| Example 2 | MeO-TFATA | LiTFSI | FASnI$_3$ | 338 | 19.4 | 0.62 | 4.1 |
| Example 3 | MeO-TFATA | — | GA$_{0.17}$FA$_{0.83}$SnI$_3$ | 336 | 17.1 | 0.50 | 2.9 |
| Example 4 | MeO-TFATA | LiTFSI | GA$_{0.17}$FA$_{0.83}$SnI$_3$ | 377 | 19.1 | 0.61 | 4.4 |
| Comparative example 1 | PTAA | — | FASnI$_3$ | 301 | 3.6 | 0.43 | 0.46 |
| Comparative example 2 | Spiro-OMETAD | LiTFSI | FASnI$_3$ | 76 | 0.03 | 0.25 | 0.0 |
| Comparative example 3 | P3HT | — | FASnI$_3$ | 184 | 14.7 | 0.44 | 1.2 |
| Comparative example 4 | P3HT | LiTFSI | FASnI$_3$ | 132 | 15.4 | 0.33 | 0.7 |

As is clear from the results listed in Table 1, since the solar cells prepared in Examples 1 to 4 included a photoelectric conversion layer 5 including a tin-based perovskite compound and a hole transport layer 6 including MeO-TFATA, they all had a high photoelectric conversion efficiency of greater than 2.5%. In contrast, the solar cells prepared in Comparative examples 1 to 4, which included a photoelectric conversion layer 5 including a tin-based perovskite compound and a hole transport layer 6 that did not include MeO-TFATA, all had a low photoelectric conversion efficiency of equal to or less than 1.2%.

As is clear from a comparison between Examples 1 and 2 and a comparison between Examples 3 and 4, a solar cell that included a hole transport layer 6 including LiTFSI in addition to MeO-TFATA had a higher photoelectric conversion efficiency than a solar cell that included a hole transport layer 6 that did not include LiTFSI. As is clear from a comparison between Comparative examples 3 and 4, in the case where LiTFSI was added to a hole transport layer 6 that included a hole transport material other than MeO-TFATA (i.e., P3HT in Comparative examples 3 and 4) and did not include MeO-TFATA, the photoelectric conversion efficiency was reduced. The above results confirm that the addition of LiTFSI to a hole transport layer of a tin-based perovskite solar cell increases the photoelectric conversion efficiency of the solar cell only when the hole transport layer includes MeO-TFATA.

The solar cell according to the present disclosure may be useful as, for example, a solar cell installed on the roof

What is claimed is:

1. A solar cell comprising:
   a first electrode;
   a second electrode;
   a porous titanium oxide layer;
   a photoelectric conversion layer disposed on the porous titanium oxide layer, the porous titanium oxide layer and the photoelectric conversion layer being interposed between the first electrode and the second electrode; and
   a hole transport layer interposed between the first electrode and the photoelectric conversion layer,
   wherein at least one electrode selected from the first electrode and the second electrode is transparent to light,
   wherein the photoelectric conversion layer includes a perovskite compound constituted by a monovalent cation, a divalent cation, and a halogen anion,
   wherein the monovalent cation includes at least one selected from the group consisting of a formamidinium cation and a methylammonium cation,
   wherein the divalent cation includes a Sn cation,
   wherein the halogen anion includes an iodide ion,
   wherein the hole transport layer includes 4,4',4"-tris[9,9-dimethyl-2-fluorenyl(4-methoxy-phenyl)amino]triphenylamine,
   wherein the perovskite compound is at least one selected from the group consisting of
   a perovskite compound represented by FASnI$_3$ and
   a perovskite compound represented by GA$_{0.17}$FA$_{0.83}$SnI$_3$,
   wherein the hole transport layer further includes lithium bis(trifluoromethanesulfonyl)imide.

2. The solar cell according to claim 1,
   wherein the monovalent cation further includes a guanidinium cation.

3. The solar cell according to claim 1,
   wherein a content of the Sn cation in the divalent cation is equal to or greater than 50 mol %.

4. The solar cell according to claim 1, further comprising:
   an electron transport layer interposed between the second electrode and the photoelectric conversion layer.

* * * * *